(12) United States Patent
Gowni et al.

(10) Patent No.: US 6,295,627 B1
(45) Date of Patent: Sep. 25, 2001

(54) METHOD AND APPARATUS FOR THE AUTOMATED DESIGN OF MEMORY DEVICES

(75) Inventors: Shiva P. Gowni, San Jose; Alpesh B. Patel, Fremont, both of CA (US); Bo B. Wang, Austin, TX (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/285,510

(22) Filed: Apr. 2, 1999

Related U.S. Application Data

(60) Provisional application No. 60/110,895, filed on Dec. 4, 1998.

(51) Int. Cl.[7] .................................................... G06F 17/50
(52) U.S. Cl. ..................................................... 716/1
(58) Field of Search .............................. 716/4, 1

(56) References Cited

U.S. PATENT DOCUMENTS 5,598,344 * 1/1997 Dangelo .................................. 716/4

* cited by examiner

*Primary Examiner*—Matthew Smith
*Assistant Examiner*—Thuan Do
(74) *Attorney, Agent, or Firm*—Wagner, Murabito & Hao LLP

(57) ABSTRACT

A design, layout, schematic, netlist, abstract or other equivalent circuit representations for a memory that may have redundant circuitry may be generated from a set of user inputs acquired through a graphical user interface. Based on the user inputs one or more leaf cells is/are generated. Then using the leaf cells, a design database for the layout is generated from the user inputs. The design database reflects physical hierarchies of the layout and may include redundancy circuitry within a data and/or address path, parallel to a non-redundant data and/or address path within the layout. The above-mentioned parameters described by the user inputs may include an array size, a defect rate, and/or a leaf cell design, layout or schematic. This scheme may be embodied as a set of computer-readable instructions, for example to be executed by a computer system. The user may rearrange the memory array architecture by changing a parameter selected from the group consisting of array size, defect rate, line width, line spacing, line length, gate width, transistor spacing, gate length, transistor length, resistivity, capacitance, and other physical and/or electrical device parameters.

4 Claims, 3 Drawing Sheets

METHOD AND APPARATUS FOR THE AUTOMATED DESIGN OF MEMORY DEVICES

This application claims benefit of Provisional Application Ser. No. 60/110,895 filed Dec. 4, 1998.

FIELD OF THE INVENTION

The present invention relates to schemes for the automated design of memory devices and/or components thereof. In particular, the schemes described herein may be applied to develop a compiler that is useful during the design of memory arrays, the incorporation of redundancy logic and the design of semi-custom control logic and decoders of memory devices.

BACKGROUND

Modern integrated circuit designers are often confronted with the problem of developing new circuit/component designs in as short a time as possible in order to minimize product time to market. Although complicated, often this task becomes one of fitting a desired set of circuit components into as small an area as possible and arranging interconnecting conductors between those elements in a manner that minimizes the lengths of the conductive paths. To compound this problem, the design solution is usually subject to a minimum spacing geometry, dictated by the resolution limits (and other technology factors) of the fabrication process employed. When a designer develops a new circuit or component, he/she typically begins by creating a schematic for the design. Such design processes have been automated to some degree for a number of years and a typical schematic produced through such processes usually consists of symbols representing the basic units of the design connected together with signals (or nets—short for networks). The symbols are usually chosen from a library of parts that the designer draws upon to build the schematic. The interconnection of the symbols and the signals (e.g., as stored in a design database) creates the connections needed to specify the design such that a netlist can be derived from the connections. The netlist can then be used to create a simulation model of the design to verify its operation before the actual component is built.

The manner in which the schematic representation of the overall circuit is developed may vary depending upon whether fully custom or semi-custom circuit elements need to be employed in the design. Thus, circuit designers often begin by searching a standard library of circuit elements to see if any will match the new circuit's requirements. The search may begin at a relatively high level to determine whether any previously defined circuit elements satisfy the needed chip-level or lower level (called "cells") architectures. The number of hierarchical levels of cell structure will depend on the nature and complexity of the circuitry being designed.

If matching cells are found, the designer can proceed to synthesize the circuit. Otherwise, the designer may be required to build semi-custom cells from available low-level cells. In the event no existing circuit elements can satisfy the necessary design requirements, the designer may be forced to develop custom solutions. For example, decoding logic used in memory devices are typically custom implementations. Once the circuit elements have been chosen, the circuit is synthesized and optimized for a given set of technology rules (i.e., the design rules that describe limitations of the fabrication processes to be used). Commercial computer programs for performing such routines are available and are commonly used to perform such tasks.

The netlist produced during the synthesis and optimization process can be used to provide the information needed by a routing software package to complete the actual design. The routing software will create the physical connection data to create the layer information needed for the component specified by the design. The resulting design may then be simulated to test its behavior and, if necessary, the design can be modified to meet target design goals.

Once a design has been approved through simulation, tape out may be ordered. In the tape out process, the symbolic representation of the circuit is translated into an actual layout using a commercial layout editor program. As with the synthesis programs, layout editors utilize tables of design rules that are specific to the ultimate manufacturing process to be used to produce computer-readable files (masks) that can be used in the fabrication of the integrated circuit.

This conventional design methodology is flawed in as much as it requires that the designer be familiar with the specifics of the design language used to specify the components of the design. As design languages evolve and are replaced by new languages, this forces designers to relearn these languages. Further, this design procedure becomes tedious when designers are faced with developing an entire family of components, individual units of which may share some similarities but likely differ in other regards. Moreover, although conventional simulation tools often perform better (i.e., provide results more quickly) when the underlying circuit design is specified in terms of a hierarchical data structure, most conventional design tools do not provide such output. Rather, conventional design tools tend to provide so-called "flattened" data structures. Thus, simulation times (and, hence, overall design times) are often unnecessarily long.

Further deficiencies of these conventional design processes are also apparent where the circuit being designed is a random access memory (RAM) device. Often, to improve the production yield of RAMs, it is necessary to add redundant rows or blocks in the memory core; this way, when a flawed row of memory cells is formed, the row can be replaced by a redundant row. However, it is difficult for the designer to gauge the impact of the inclusion of such redundancy features on the overall chip aspect ratio because conventional design tools do not allow for the easy inclusion of redundant elements.

SUMMARY OF THE INVENTION

In one embodiment, a method of generating a design, layout, schematic, netlist, abstract or other equivalent circuit representations (hereinafter "layout") for a memory that may have redundant circuitry is provided. In general, a set of user inputs describing parameters of the layout is acquired through a graphical user interface. Based on these user inputs, or at least a subset thereof, one or more leaf cells is/are generated. Then using the leaf cells, a design database for the layout is generated from the user inputs. The design database reflects physical hierarchies of the layout and includes redundant circuitry when the memory contains at least 256 K bits and/or at least one of the user inputs meets or exceeds a predetermined value (or combination of predetermined values) for implementing the redundant circuitry. In some cases, the redundant circuitry may be a data and/or address path, parallel to a non-redundant data and/or address path within the layout. The above-mentioned parameters described by the user inputs may include an array size, a defect rate, and/or a leaf cell design, layout or schematic. This scheme may be embodied as a set of computer-readable instructions, for example to be executed by a computer system.

In a further embodiment, a method of producing a peripheral circuit layout that includes redundancy logic is provided. In this scheme variations of physical device hierarchies for the peripheral circuitry are automatically synthesized, based on lower level cell parameters of the device that embodies the peripheral circuit. In addition to automatically synthesizing the layout, the method may provide for automatically characterizing the layout. The parameters of the layout generally may include line width, line spacing, line length, gate width, transistor spacing, gate length, transistor length, resistivity, capacitance, and/or other physical or electrical device parameters. As before, this scheme may be embodied as a set of computer-readable instructions, for example to be executed by a computer system such as a workstation. The normal path(s) and the redundant path(s) can be tweaked (e.g., for speed) independently, if desired.

In yet another embodiment, an advanced graphical interface configured to allow a user to rearrange a memory array architecture by selecting one or more of a plurality of lower level leaf cells is provided. More particularly, the user may rearrange the memory array architecture by changing a parameter selected from the group consisting of array size, defect rate, line width, line spacing, line length, gate width, transistor spacing, gate length, transistor length, resistivity, capacitance, and other physical and/or electrical device parameters.

And, in yet an additional embodiment, a design, layout, schematic, netlist, abstract or other equivalent circuit representations (hereinafter "layout") for an integrated circuit having a plurality of non-redundant circuits and at least one redundant circuit may be generated by acquiring a set of user inputs describing parameters of the layout through a graphical user interface; generating one or more leaf cells from a subset of the user inputs; and automatically generating, from the leaf cells, a design database for the layout from the user inputs. Preferably, the design database includes the redundant circuitry and reflects physical hierarchies of the layout. In this scheme, each of the redundant circuits and the non-redundant circuits include an input path, a functional circuit, and an output path, the redundant circuits being parallel to the non-redundant circuits.

Other features and advantages of the present invention are described below with reference to the accompanying drawings.

BRIEF DESCRIPTION OF THE DRAWINGS

The present invention is illustrated by way of example, and not limitation, in the figures of the accompanying drawings in which like reference numerals refer to similar elements and in which.

DETAILED DESCRIPTION

Figure 1:
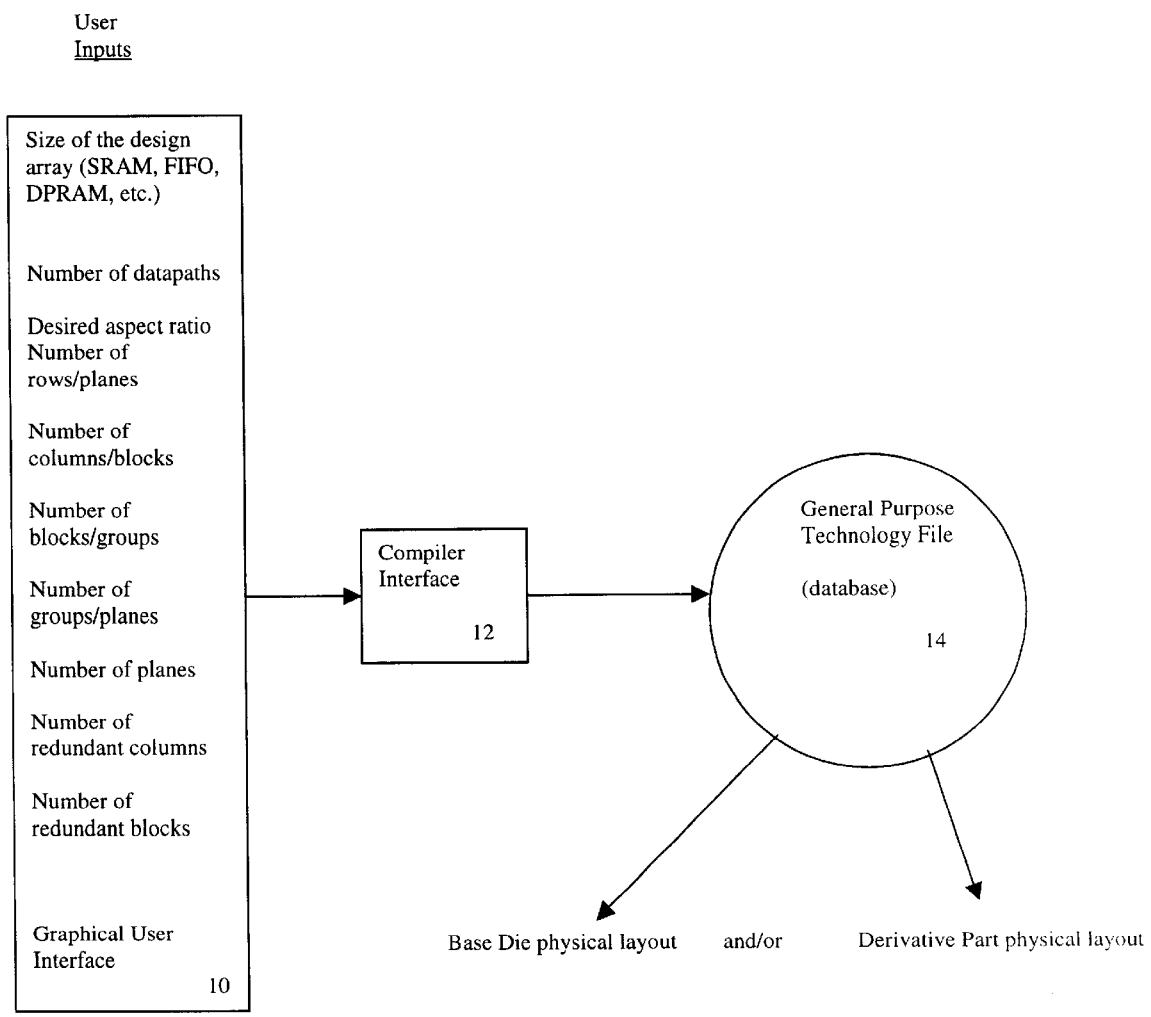
FIG. 1 illustrates the overall process of producing a design database for a memory device using a graphical user interface according to an embodiment of the present invention.

A scheme for the automated design of memory devices and/or components thereof is disclosed herein. Although discussed with reference to certain illustrated embodiments, upon review of this specification, those of ordinary skill in the art will recognize that the present methodologies may find application in a variety of computer-aided design, synthesis and/or simulation schemes. Therefore, in the following description the illustrated embodiments should be regarded as exemplary only and should not be deemed to be limiting in scope.

As will be apparent, one aspect of the automated design scheme involves the use of a graphical user interface (GUI) that has been developed to interface with standard (i.e., commercially available) automated design tools. The GUI is configured to acquire user inputs for the generation of a circuit or component design to allow for the automatic generation of a design database. This interface thus supplies the process of generating technology files and users are not required to be design language (e.g., SKILL) literate. The GUI has the capability to generate variations of physical database hierarchies (schematics, layouts, etc.) based on lower level (leaf) cells such as memory cells, sense amplifiers, etc. Thus, this design-aiding tool may be used for the design of RAMs, FIFOs (first-in-first-out), DPRAMS (dual port RAMs), etc. The GUI also has the capability to control the redundancy logic of the design and also facilitates the control of aspect ratios of the design through defined global variables.

An additional aspect of the GUI is its ability to incorporate redundant memory elements into a design, based on user input. This allows designers to run "what if" scenarios/analysis and/or actually implement redundancy elements programmatically (i.e., in a fashion that is much quicker than conventional manual design methods). Any re-tiled higher level design can then be automatically characterized (e.g., using in-house or external tools and post-processing) and the output (input/output capacitances, delays, etc.) of the memory array (or higher level re-tiled abstraction) can drive interface circuitry (e.g., for optimizing the overall design). With this approach, there is no limit on aspect ratio or density of memory that can be handled.

In addition to the memory array features, row decoders, group/column decoders and associated logic for each may be produced using these high-level design techniques (e.g., using Synopsys™ Synthesis or register transfer level (RTL) computer-readable code). Address bits along with redundancy signals may be applied as inputs and the resulting design databases will have "normal" wordline outputs that will drive the memory array, and redundant wordlines that will drive the redundant array. Thus, the redundancy logic is arranged in parallel with the "normal" logic as inputs to the array. A similar approach may be used for redundant columns or blocks. Using these methods, "tweaking" (e.g., speed matching) of the normal path(s) and the redundant path(s) may be done independently, if desired. Simulation shows the speed of this redundant logic scheme is comparable to (or better than) the normal logic.

The GUI is particularly well suited for obtaining physical layouts of derivative parts from a leaf die, in a short period of time. In addition, the methodologies used to produce the specifications of the design may also automate the generation of the base die array, as well as the generation of arrays for derivative parts. In other words, the GUI is capable of producing the physical layout of derivative parts based on the parameters specified by the user.

In the past, most of the initial design of semiconductor RAM devices has been done by hand. This was necessitated, at least in part, because of the need for custom logic at several stages of the devices, for example decoders and the like. Further, available automated design tools were incapable of handling the integration of redundancy logic and/or redundant memory blocks within the devices. Thus, the design and layout processes for RAM devices was tedious and time consuming.

To alleviate these problems, the present GUI allows for the capture of user inputs to aid in the design process. As shown in FIG. 1, a number of user inputs such as the size of the target array (e.g., which may be used in SRAMs, FIFOs, DPRAMs, etc.); the number of data paths; the desired aspect ratio; the number of rows/planes, columns/blocks, blocks/groups and/or groups/planes; and/or the number of redundant rows, columns and/or blocks may be provided through GUI 10. In such a scheme, a block may be considered a single sense amplifier together with its memory cell array. For example, a block may include eight columns of memory cells (of any number of rows) butted against a single sense amplifier. A group is then a selection of blocks arrayed together. A group may include additional circuit elements such as strapping cells, local wordline drivers; periphery cells and, sometimes, row decoder cells. Super groups may be used to identify groups that share common circuitry, such as shared row decoders.

The array itself may be homogeneous (e.g., based upon only a single master cell) or heterogeneous (i.e., based upon more than one master cell). In either case, the various cell instances may have different orientations. For a regular array (whether homogeneous or heterogeneous) all cells in a given row will have the same height and all cells in a given column will have the same width.

In some cases, the GUI may be complemented by an extension or interface that allows for user customization. In this way, skilled designers may augment the GUI tools to suit their particular needs while others may simply use the standard GUI tool set to complete a design. In any event, the inputs provided by GUI 10 will be used to generate schematics for simulation and verification purposes. This is accomplished by compiling the user inputs through an interface 12 that produces a general technology database 14. This database 14 may then be used to generate layouts for base dies or, with modifications to the leaf cells (e.g., the memory core cells or the sense amplifier cells, etc.), any derivatives thereof. By supplying the process of generating the technology file database 14, the compiler interface 12 (and its GUI 10) relieves users from the burden of having to constantly be aware of design language variations and revisions, etc.

Importantly, the database output that is provided by the compiler interface 12 is readable by conventional simulation and layout tools. Moreover, the compiler interface 12 automatically provides for any redundant rows/columns specified by the use, thus allowing for later automatic redundancy simulation and verification. In some cases, to facilitate any need for layout, verification and/or simulation at various stages of the design process, the compiler interface 12 may be configured to run in a piece-wise fashion (i.e., with certain break points that allow a user to stop and test a portion of a design). For example, a break point may be set at the block level of a layout to view or test that portion of the design. For optimization purposes, the compiler interface 12 may be configured so that it does not compile an entire group as an independent object. Rather, group compilation may be included within a block.

As indicated above, compilation is performed for a given set of technology rules, with specific cells (e.g., leaf cells) created for that technology. The technology rules may define the compiler array structures, dependencies, defaults, etc. The technology rules are usually embodied as a library, which may exist as a SKILL™ structure (i.e., a series of property lists). At the root level, the technology rules may describe how the compile blocks are to be constructed using the leaf cells in the library.

To summarize then, using GUI 10, a user may automatically (e.g., according to a set of computer-readable instructions, for example to be executed by a computer system) generate a design, layout, schematic, netlist, abstract or other equivalent circuit representations (collectively referred to as a "layout") for a memory device that may have redundant circuitry. The user inputs, or at least a subset thereof, are used to first generate one or more leaf cells, then using the leaf cells, the design database 14 for the layout is created. Design database 14 preferably reflects that physical hierarchies of the layout and is not merely a flattened data structure. Further, the design database 14 includes redundant circuitry elements, specified according to the user inputs. The parameters described by the user inputs may include an array size, a defect rate, and/or a leaf cell design, layout or schematic. In one example these features of the design database 14 are implemented when the memory device under design contains at least 256 K bits and/or at least one of the user inputs meets or exceeds a predetermined value (or combination of predetermined values) for implementing the redundant circuitry.

Figure 2:
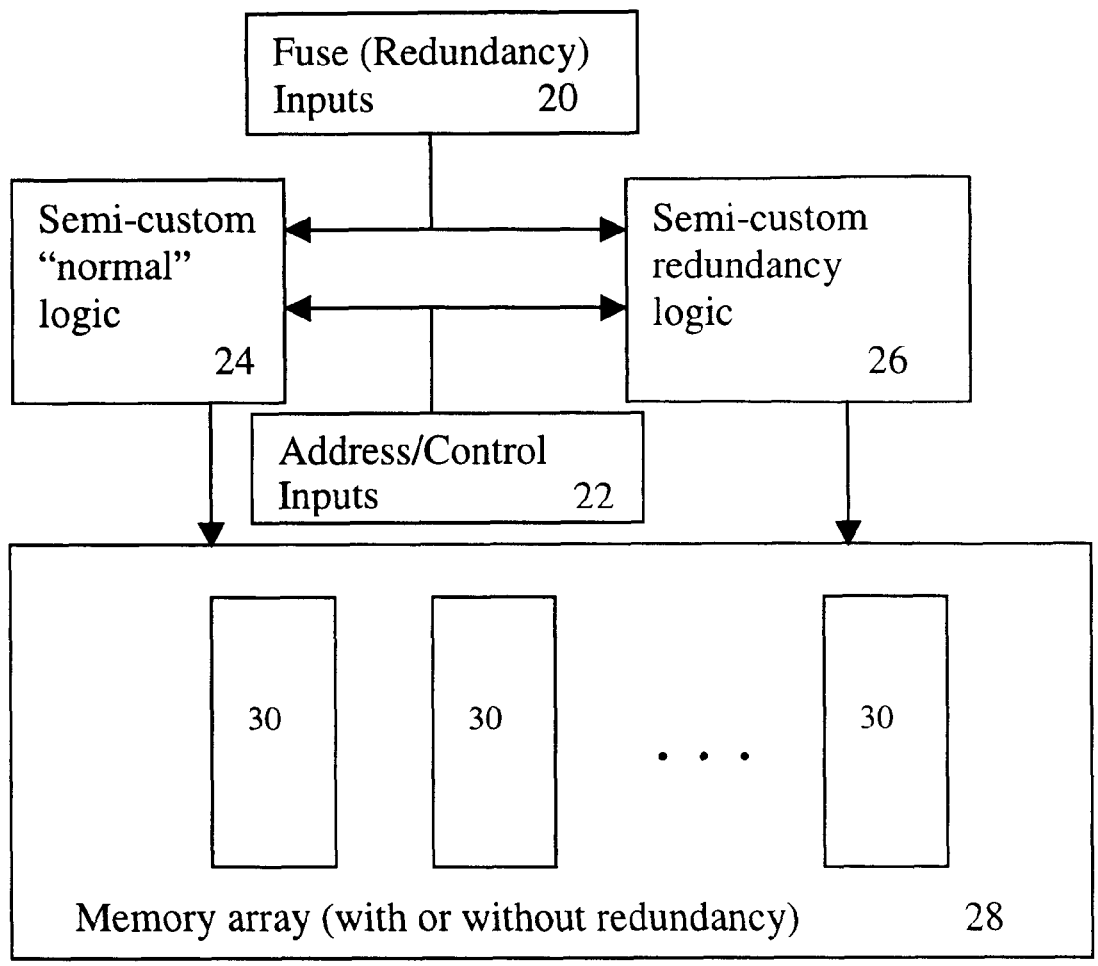
FIG. 2 illustrates a layout of a memory device including redundancy logic produced in accordance with an embodiment of the present invention.

In some cases, the redundant circuitry may be a data and/or address path, oriented parallel to a non-redundant (i.e., "normal") data and/or address path within the layout. For example, as shown in FIG. 2, redundancy (e.g., fuse) inputs 20 are laid out parallel to address/control inputs 22, and each of these inputs are provided to the normal and redundant logic blocks 24 and 26 (e.g., decoders, drivers, etc.). The logic blocks 24 and 26 (which may exist in the data and/or address paths of the device) then drive the memory array 28 (which may be implemented with or without redundant rows and/or columns of memory cells). As indicated above, the array 28 is generally made up of a number of blocks 30. This differs from conventional compilers, where no provision is made for the inclusion of redundancy logic and/or memory cells.

In general, logic blocks 24 and 26 each include an input path, a functional circuit, and an output path. The functional circuit may be a buffer, memory/storage circuit (e.g., a memory cell, latch or register), pulse generator (e.g., a "one-shot" circuit), logic (e.g., an inverter, OR gate, NOR gate, XOR gate, XNOR gate, AND gate, NAND gate, multiplexer, demultiplexer, logic macrocell, ALU, or combination thereof, etc.), a counter, a divider, a comparator, and so on. The use of parallel redundancy circuitry 26 results in a redundant element speed path that is comparable to the speed path of the normal circuitry and further allows for individual control of the circuit area and performance for normal vs. redundancy logic. A user is also provided with the ability to "tweak" the normal and redundant speed paths independently.

Figure 3:
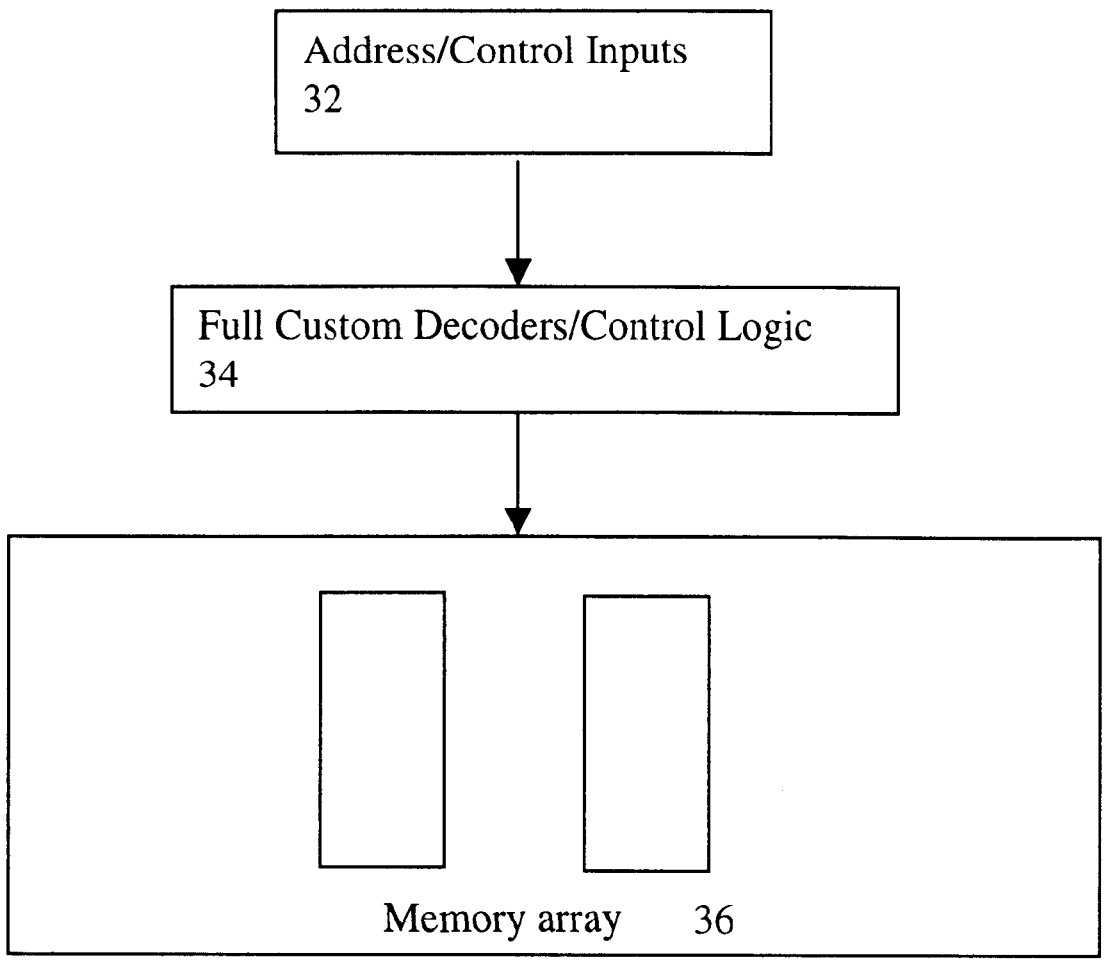
FIG. 3 illustrates a layout of a memory device produced in accordance with conventional design methodologies.

Moreover, the normal and redundancy logic blocks 24 and 26 are implemented as semi-custom, rather than fully custom logic blocks. This differs from conventional RAM compiler schemes where, as shown in FIG. 3, address inputs 32 are generally provided to fully custom control/decoder blocks 34 to drive a memory array 36. By semi-custom, it is meant that the control logic blocks 24 and 26, and, in general any peripheral circuitry, are automatically synthesized and/or characterized, based on lower level cell parameters of the memory device. The parameters of such a layout generally may include line width, line spacing, line length, gate width, transistor spacing, gate length, transistor length, resistivity, capacitance, and/or other physical or electrical device parameters. Such parameters may be specified by user input or by the technology file utilized by the compiler interface 12. The semi-custom approach helps achieve optimal circuit area and performance to match with the physical requirements of the compiled array. Redundant paths in conventional, full custom redundancy design are typically always slower than normal paths.

In addition to the above, the GUI 10 is configured to allow a user to rearrange the architecture of a memory array by changing a parameters of the lower level leaf cells. For example, parameters such as array size, defect rate, line width, line spacing, line length, gate width, transistor spacing, gate length, transistor length, resistivity, capacitance, and other physical and/or electrical device parameters may be modified to produce alternative base dies and/or derivatives of a base die.

Thus a scheme for the automated design of memory devices and/or components thereof has been described. Although the foregoing description and accompanying figures discuss and illustrate specific embodiments, it should be appreciated that the present invention is to be measured only in terms of the claims that follow.

What is claimed is:

1. A computer implemented method for generating a netlist for a memory comprising:

a) acquiring a set of user inputs describing parameters of the netlist through a graphical user interface, wherein the parameters comprise an array size, a defect rate, and a leaf cell design and wherein the memory comprises redundant circuitry comprising redundant data paths and redundant address paths for redundant columns;

b) generating one or more leaf cells from a subset of the user inputs; and c) automatically generating, from the leaf cells, a design database for the netlist from the user inputs, wherein the design database reflects physical hierarchies of the netlist, and wherein the step of automatically generating further comprises the steps of; i) automatically generating redundant circuitry when the memory contains at least 256 K bits, and ii) automatically generating redundant circuitry when a user input has met a predetermined value.

2. A computer implemented method for generating a peripheral circuit netlist, including redundancy logic, comprising:

a) acquiring a set of user inputs describing parameters of the peripheral circuit netlist through a graphical user interface, wherein the parameters comprise line width, line spacing, line length, gate width, transistor spacing, resistivity, and capacitance, and wherein the peripheral circuit netlist is for redundant circuitry comprising redundant data paths and redundant address paths for redundant columns;

b) generating one or more leaf cells from a subset of the user inputs;

c) automatically synthesizing variations of physical device hierarchies for the peripheral circuitry based on parameters of the leaf cells; and d) automatically generating, from the leaf cells and the variations of physical device hierarchies, a design database for the peripheral circuit netlist, and wherein the step of automatically generating further comprises the step of automatically generating redundant circuitry when a user input has met a predetermined value.

3. An advanced graphical interface configured to allow a user to rearrange a memory array architecture by performing the steps of:

acquiring a set of user inputs describing parameters of the memory array architecture through a graphical user interface, wherein the parameters comprise an array size, a defect rate, and a leaf cell design and wherein the memory array architecture comprises redundant circuitry comprising redundant data paths and redundant address paths for redundant columns;

generating leaf cells from a subset of the user inputs;

automatically generating, from the leaf cells, a design database for the memory array architecture from the user inputs, wherein the design database reflects physical hierarchies of the memory array architecture, and wherein the step of automatically generating further comprises the steps of automatically generating redundant circuitry when the memory array architecture contains at least 256 K bits, and automatically generating redundant circuitry when a user input has met a predetermined value;

accepting user selection of at least one leaf cell; and automatically generating, from the selected leaf cells, a rearranged memory array architecture.

4. A computer implemented method of generating a netlist for an integrated circuit having a plurality of non-redundant circuits and at least one redundant circuit, comprising:

a) acquiring a set of user inputs describing parameters of the netlist through a graphical user interface;

b) generating one or more leaf cells from a subset of the user inputs; and c) automatically generating, from the leaf cells, a design database for the netlist from the user inputs, wherein the step of automatically generating further comprises the step of automatically generating redundant circuitry when a user input has met a predetermined value such that the design database includes the redundant circuitry and reflects physical hierarchies of the netlist, and wherein each redundant circuit is combined in a parallel circuit fashion with the non-redundant circuits to comprise an input path, a functional circuit, and an output path, and wherein the redundant circuitry comprises redundant data paths and redundant address paths for redundant columns.

* * * * *